United States Patent
Shen et al.

(10) Patent No.: US 8,872,561 B2
(45) Date of Patent: Oct. 28, 2014

(54) SYSTEMS AND METHODS FOR EDGE CONTROL BASED ON DETECTING CURRENT DIRECTION IN A SWITCHED OUTPUT STAGE

(71) Applicant: Cirrus Logic, Inc., Austin, TX (US)

(72) Inventors: Dan Shen, Austin, TX (US); Lingli Zhang, Austin, TX (US); Johann Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 13/829,831

(22) Filed: Mar. 14, 2013

(65) Prior Publication Data

US 2014/0266310 A1     Sep. 18, 2014

(51) Int. Cl.
*H03K 5/12*     (2006.01)
*H03K 5/1534*   (2006.01)

(52) U.S. Cl.
CPC .................................. *H03K 5/1534* (2013.01)
USPC .......................................... 327/170; 327/108

(58) Field of Classification Search
USPC .......................... 327/108, 170; 326/82–83, 86
See application file for complete search history.

(56) References Cited

U.S. PATENT DOCUMENTS

| | | | |
|---|---|---|---|
| 4,829,199 A | 5/1989 | Prater | |
| 4,855,623 A | 8/1989 | Flaherty | |
| 5,121,000 A * | 6/1992 | Naghshineh | ..................... 326/33 |
| 5,237,213 A | 8/1993 | Tanoi | |
| 5,450,019 A * | 9/1995 | McClure et al. | ................ 326/28 |
| 6,018,256 A | 1/2000 | Kumagai et al. | |
| 6,137,322 A | 10/2000 | Ten Eyck | |
| 6,265,915 B1 | 7/2001 | Rider et al. | |
| 6,366,129 B1 | 4/2002 | Douglas, III et al. | |
| 6,373,300 B2 | 4/2002 | Welch et al. | |
| 7,190,225 B2 | 3/2007 | Edwards | |
| 7,215,152 B2 | 5/2007 | Dubey | |
| 7,649,414 B2 | 1/2010 | Kaya et al. | |
| 7,746,155 B2 | 6/2010 | Labbe | |
| 7,973,523 B2 * | 7/2011 | Cheng | ........................... 323/284 |
| 8,085,081 B2 | 12/2011 | Ogawa et al. | |
| 8,184,831 B2 | 5/2012 | Lin | |
| 2010/0067152 A1* | 3/2010 | Nakahashi et al. | ............. 361/18 |
| 2010/0164590 A1 | 7/2010 | Tsuji et al. | |
| 2010/0244930 A1 | 9/2010 | Ogawa et al. | |
| 2012/0014025 A1* | 1/2012 | Sato et al. | .................... 361/93.1 |

* cited by examiner

*Primary Examiner* — An Luu
(74) *Attorney, Agent, or Firm* — Jackson Walker L.L.P.

(57) ABSTRACT

In accordance with these and other embodiments of the present disclosure, an apparatus and a method may include receiving a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node. The method may also include receiving a second input configured to indicate a gate voltage of a gate terminal of a first one of the pull-up driver device and the pull-down driver device. The method may further include detecting direction of an output current flowing into or out of the output node based on the first input and the second input.

32 Claims, 5 Drawing Sheets

SYSTEMS AND METHODS FOR EDGE CONTROL BASED ON DETECTING CURRENT DIRECTION IN A SWITCHED OUTPUT STAGE

FIELD OF DISCLOSURE

The present disclosure generally relates to integrated circuits, and, more particularly, to systems and methods for determining load current direction in a switched output stage of an electronic circuit, for example a switched output stage of a power converter.

BACKGROUND

Many electronic devices on the market today often use power converters to convert electric energy from one form to another (e.g., converting between alternating current and direct current), amplifying a voltage or current of an electrical signal, modifying a frequency of an electrical signal, or some combination of the above. Examples of power converters may include boost converters, buck converters, and audio amplifiers (including, but not limited to Class D and Class H amplifiers). Such power converters often employ a switched output stage, an example of which is shown in FIG. 1. In FIG. 1, switched output stage 100 comprises a pull-up device 102 (e.g., a switch, a p-type metal-oxide-semiconductor field effect transistor, etc.) coupled at its non-gate terminals between a supply voltage and an output node and a pull-down device 104 (e.g., a switch, an n-type metal-oxide-semiconductor field effect transistor, etc.) coupled at its non-gate terminals between a ground voltage and the output node. Predriver circuitry 106 may receive an input voltage $v_{IN}$ (typically a pulse-width-modulated input voltage signal) and apply control logic and/or buffering to such input voltage to drive a pull-up driver device driving signal voltage $v_P$ to the gate terminal of pull-up device 102 and to drive a pull-down driver device driving signal voltage $v_N$ to the gate terminal of pull-down device 104, wherein $v_P$ and $v_N$ are each a function of $v_{IN}$. Accordingly, switched output stage 100 generates an output voltage $v_{OUT}$ to its output node which is a function of $v_{IN}$.

To generate the output voltage $v_{OUT}$, pull-up device 102 and pull-down device 104 will alternately turn on based on $v_P$ and $v_N$. In addition, load current delivered by switched output stage to a load coupled to the output node. Such load may apply a low-pass filter to the output voltage $v_{OUT}$ such that the load current is phase-shifted from output voltage $v_{OUT}$ which may have one of two directions—flowing "out" from switched output stage 100 to the load or flowing "in" from the load to switched output stage 100—wherein such direction of an instantaneous current may not be readily known. If current is flowing from the load to the output node, the drive voltage $v_N$ of pull-down device 104 effectively controls voltage and current transition of the output node, while if current is flowing from the output node to the load, the drive voltage $v_P$ of pull-up device 102 effectively controls voltage and current transition of the output node. Thus, if current direction can be effectively determined, such information might be used to control output node transitions.

SUMMARY

In accordance with the teachings of the present disclosure, certain disadvantages and problems associated with output signal integrity of a switched output stage of an electronic circuit.

In accordance with embodiments of the present disclosure, an apparatus may include a first input, a second input, and an output current direction detection circuit. The first input may be configured to indicate an output voltage of an output node of a switched output stage comprising a pull-down driver device coupled at its non-gate terminals between a ground voltage and the output node and a pull-up driver device coupled at its non-gate terminals between a supply voltage and the output node. The second input may be configured to indicate a gate voltage of a gate terminal of a first one of the pull-up driver device and the pull-down driver device. The output current direction detection circuit may be configured to detect direction of an output current flowing into or out of the output node based on the first input and the second input.

In accordance with these and other embodiments of the present disclosure, a method may include receiving a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node. The method may also include receiving a second input configured to indicate a gate voltage of a gate terminal of a first one of the pull-up driver device and the pull-down driver device. The method may further include detecting direction of an output current flowing into or out of the output node based on the first input and the second input.

In accordance with these and other embodiments of the present disclosure, an apparatus may include a first input, a second input, and a predriver circuit. The first input may be configured to indicate an output voltage of an output node of a switched output stage comprising a pull-down driver device coupled at its non-gate terminals between a ground voltage and the output node and a pull-up driver device coupled at its non-gate terminals between a supply voltage and the output node. The second input may be configured to indicate a gate voltage of a gate terminal of a first one of the pull-up driver device and the pull-down driver device. The predriver circuit may be configured to select a drive strength for driving the gate terminal of a second one of the pull-up driver device and the pull-down driver device to a rail voltage based on the first input and the second input.

In accordance with these and other embodiments of the present disclosure, a method may include receiving a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node. The method may also include receiving a second input configured to indicate a gate voltage of a gate terminal of a first one of the pull-up driver device and the pull-down driver device. The method may further include selecting a drive strength for driving the gate terminal of a second one of the pull-up driver device and the pull-down driver device to a rail voltage based on the first input and the second input.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
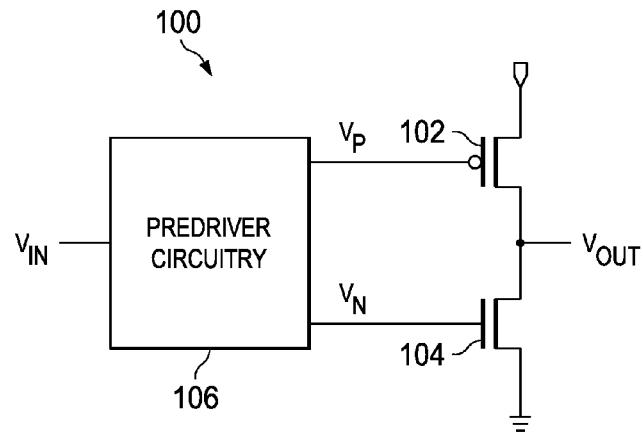
FIG. 1 illustrates a switched output stage for a power converter, as is known in the art.
Figure 2:
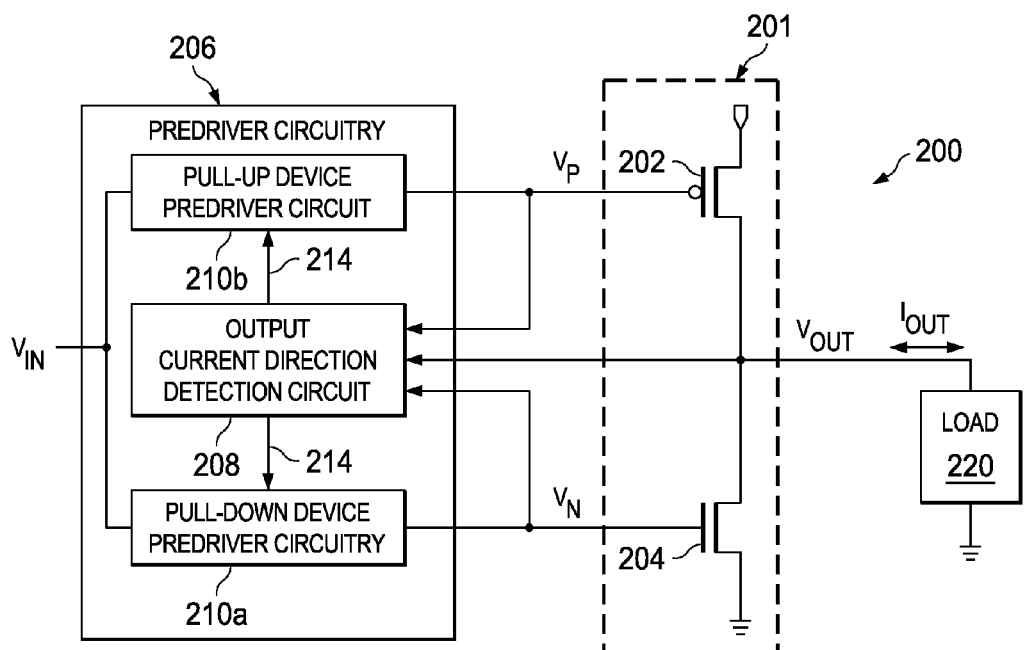
FIG. 2 illustrates an example circuit for controlling predriver signals to switched output stage of a power converter based on an output current direction, in accordance with embodiments of the present disclosure.

FIG. 2 illustrates an example circuit 200 for controlling predriver signals to switched output stage 201 of a power converter based on an output current direction, in accordance with embodiments of the present disclosure. As shown in FIG. 2, circuit 200 may comprise a switched output stage 201, predriver circuitry 206, and a load 220.

Switched output stage 201 may comprise a pull-up driver device 202 (implemented as a p-type metal-oxide-semiconductor field effect transistor in the embodiments represented by FIG. 2) coupled at its non-gate terminals between a supply voltage and an output node and a pull-down driver device 204 (implemented as an n-type metal-oxide-semiconductor field effect transistor in the embodiments represented by FIG. 2) coupled at its non-gate terminals between a ground voltage and the output node.

Predriver circuitry 206 may comprise any system, device, or apparatus configured to receive an input voltage $v_{IN}$ (e.g., a pulse-width-modulated voltage signal) and apply control logic and/or buffering to such input voltage to drive a pull-up driver device driving signal voltage $v_P$ to the gate terminal of pull-up driver device 202 and to drive a pull-down driver device driving signal voltage $v_N$ to the gate terminal of pull-down driver device 204, wherein $v_P$ and $v_N$ are each a function of $v_{IN}$. Based on respective input voltage signals $v_P$ and $v_N$ driven to their respective gates, pull-up driver device 202 and pull-down driver device 204 may drive an output voltage $v_{OUT}$ and an output current $i_{OUT}$ to load 220 which is a function of the respective input voltage signals. In some embodiments, switched output stage 201 may comprise at least a portion of an output stage of a power converter. In certain of such embodiments, such power converter may comprise a Class-D amplifier.

As shown in FIG. 2, predriver circuitry 206 may comprise an output current direction detection circuit 208, a pull-down driver device predriver circuit 210a, and a pull-up driver device predriver circuit 210b. Throughout this disclosure, pull-down driver device predriver circuit 210a and pull-up driver device predriver circuit 210b may individually be referred to as a driver device predriver circuit 210 or collectively as driver device predriver circuits 210.

Figure 3:
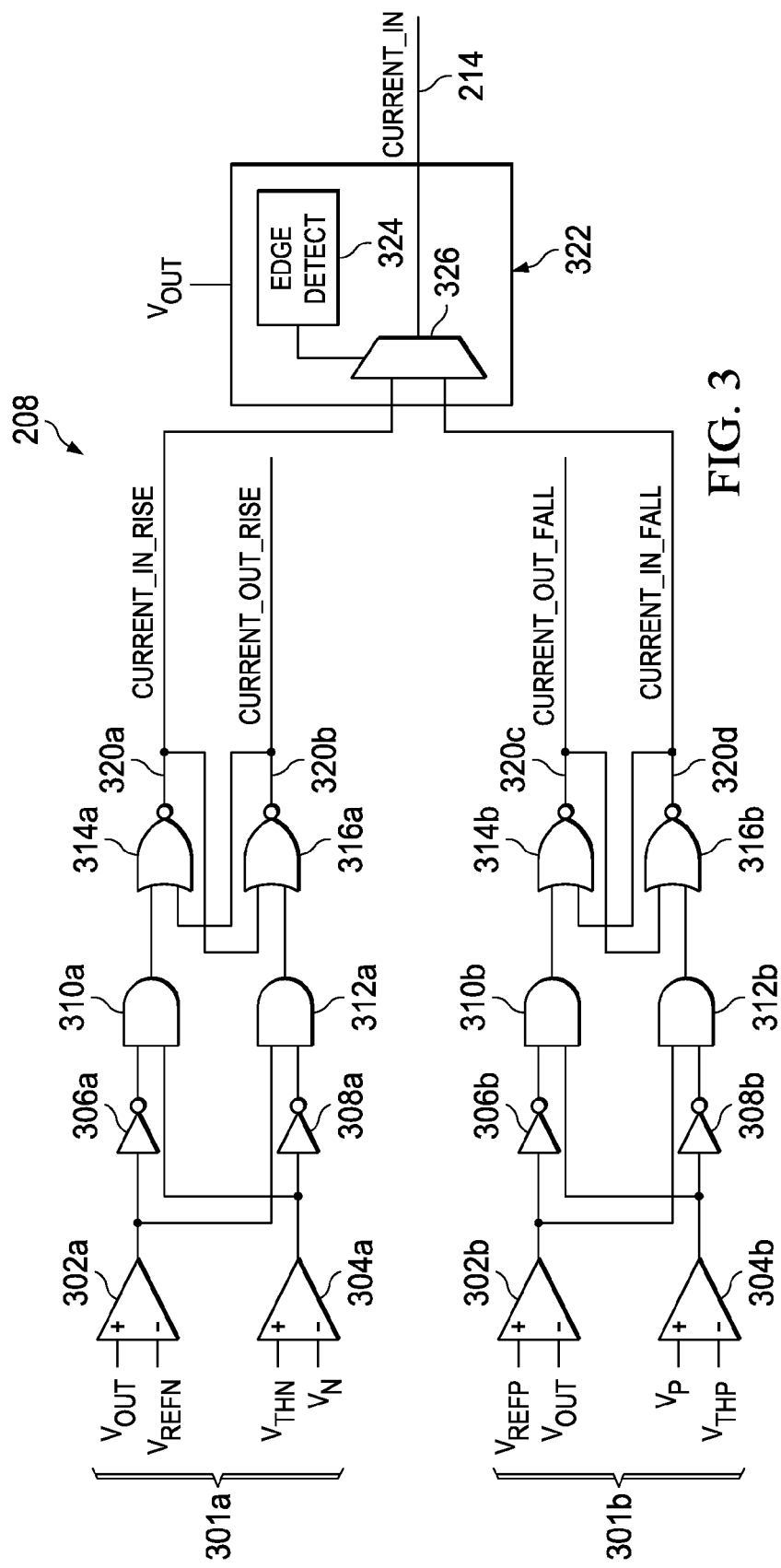
FIG. 3 illustrates an example output current direction detection circuit, in accordance with embodiments of the present disclosure.
Figure 5A:
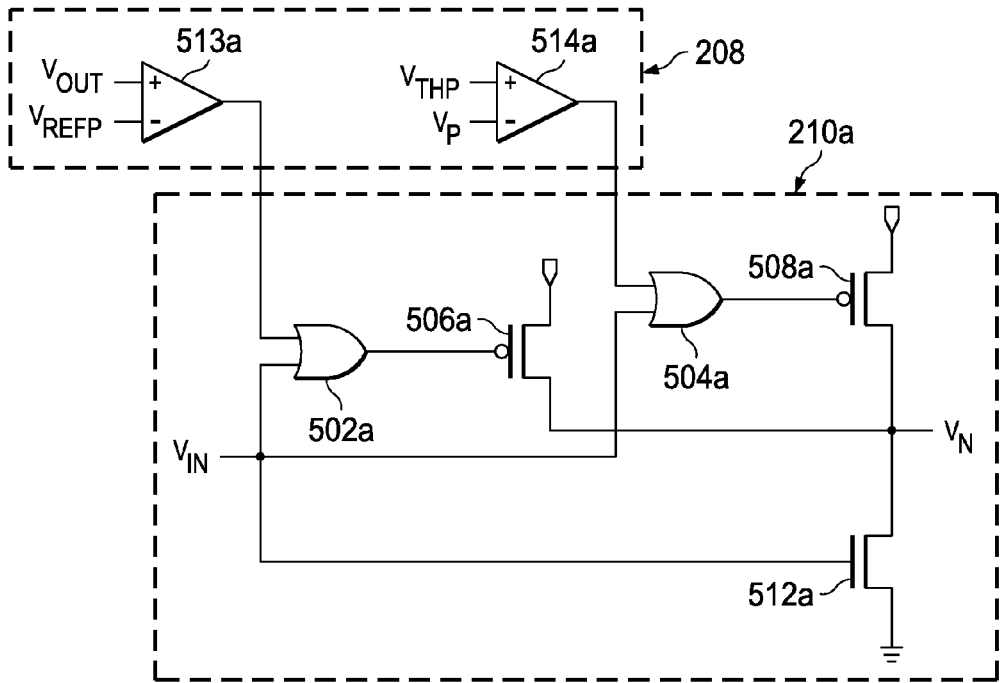
FIG. 5A illustrates another example pull-down driver device predriver circuit coupled to another example output current direction detection circuit, in accordance with embodiments of the present disclosure.
Figure 5B:
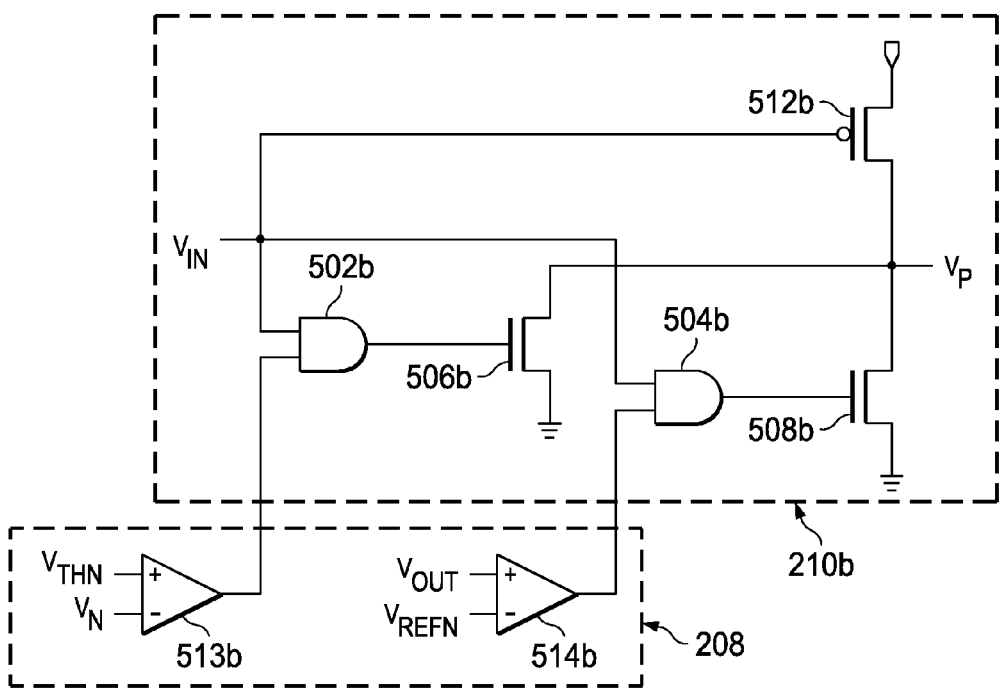
FIG. 5B illustrates another example pull-up driver device predriver circuit coupled to another example output current direction detection circuit, in accordance with embodiments of the present disclosure.

Output current direction detection circuit 208 may be any system, device, or apparatus configured to, based on sampling one or more signals associated with circuit 200, determine whether current $i_{OUT}$ is flowing from switched output stage 201 to load 220 or vice versa, and generate one or more current direction signals 214 indicative of such determined current direction. In the embodiments represented by FIG. 2, output current direction detection circuit 208 may make such determination based on the output voltage $v_{OUT}$ of switched output stage 301 and one or more of the pull-up driver device driving signal voltage $v_P$ and pull-down driver device driving signal voltage $v_N$. Example embodiments of output current direction detection circuit 208 are depicted in FIGS. 3, 5A, and 5B.

Pull-down driver device predriver circuit 210a may comprise any system, device, or apparatus configured to receive an input voltage $v_{IN}$ (e.g., a pulse-width-modulated voltage signal) and the one or more current direction signals 214 generated by output current direction detection circuit 208 and apply control logic and/or buffering to such input voltage to drive a pull-down driver device driving signal voltage $v_N$ to the gate terminal of pull-down driver device 204, wherein $v_N$ is a function of $v_{IN}$ and the one or more current direction signals 214. In some embodiments, pull-down driver device predriver circuit 210a may select a drive strength for driving the gate terminal of pull-down driver device 204 to a supply voltage based on the one or more current direction signals 214.

Similarly, pull-up driver device predriver circuit 210b may comprise any system, device, or apparatus configured to receive an input voltage $v_{IN}$ (e.g., a pulse-width-modulated voltage signal) and the one or more current direction signals 214 generated by output current direction detection circuit 208 and apply control logic and/or buffering to such input voltage to drive a pull-up driver device driving signal voltage $v_P$ to the gate terminal of pull-up driver device 202, wherein $v_P$ is a function of $v_{IN}$ and the one or more current direction signals 214. In some embodiments, pull-up driver device predriver circuit 210b may select a drive strength for driving the gate terminal of pull-up driver device 202 to a ground voltage based on the one or more current direction signals 214.

Example embodiments of driver device predriver circuits 210 are depicted in FIGS. 4A, 4B, 5A, and 5B.

Load 220 may comprise any suitable load that may be driven by switched output stage 201, including, without limitation, an audio speaker.

FIG. 3 illustrates an example output current direction detection circuit 208, in accordance with embodiments of the present disclosure. As shown in FIG. 3, output current direction detection circuit 208 may comprise a rising-edge portion 301a, a falling-edge portion 301b, and a signal selector 322. Rising-edge portion 301a may be configured to detect a direction of output current $i_{OUT}$ during a rising edge of the output voltage $v_{OUT}$, while falling-edge portion 301b may be configured to detect a direction of output current $i_{OUT}$ during a falling edge of the output voltage $v_{OUT}$.

As shown in FIG. 3, rising-edge portion 301a may include comparators 302a and 304a, logic inverters 306a and 308a, logic AND gates 310a and 312a, and feedback cross-coupled logic NOR gates 314a and 316a. Such comparators 302a and 304a may be configured such that comparator 302a receives output voltage $v_{OUT}$ at its positive input terminal and a predetermined reference voltage $v_{REFN}$ at its negative input terminal and comparator 304a receives a predetermined threshold voltage $v_{THN}$ at its positive input terminal and the pull-down driver device driving signal voltage $v_N$ at its negative input terminal. In operation, as output voltage $v_{OUT}$ increases, the output of comparator 302a may toggle from a logic 0 to a logic 1 when $v_{OUT}$ increases above the predetermined reference voltage $v_{REFN}$. Similarly, as the pull-down driver device driving signal voltage $v_N$ decreases, the output of comparator 304a may toggle from a logic 0 to a logic 1 when $v_N$ decreases below the predetermined threshold voltage $v_{THN}$.

Inverters 306a and 308a may be configured such that inverter 306a receives the output of comparator 302a at its input and inverter 308a receives the output of comparator 302a at its input. Logic AND gate 310a may be configured such that it receives the output of inverter 306a at one of its input terminals and the output of comparator 304a at its other input terminal. Logic AND gate 312a may be configured such that it receives the output of inverter 308a at one of its input terminals and the output of comparator 302a at its other input terminal. Logic NOR gate 314a may be configured such that it receives the output of AND gate 310a at one of its input terminals, the output of logic NOR gate 316a at its other input terminal, and generates an output signal CURRENT_IN_RISE 320a which is asserted if $v_{OUT}$ increases above the predetermined reference voltage $v_{REFN}$ before $v_N$ decreases below the predetermined threshold voltage $v_{THN}$, thus indicating that output current $i_{OUT}$ is flowing "in" from load 220 to switched output stage 201. Similarly, logic NOR gate 316a may be configured such that it receives the output of AND gate 312a at one of its input terminals, the output of logic NOR gate 314a at its other input terminal, and generates an output signal CURRENT_OUT_RISE 320b which is asserted if $v_N$ decreases below the predetermined threshold voltage $v_{THN}$ before $v_{OUT}$ increases above the predetermined reference voltage $v_{REFN}$, thus indicating that output current $i_{OUT}$ is flowing "out" from switched output stage 201 to load 220.

As shown in FIG. 3, falling-edge portion 301b may include comparators 302b and 304b, logic inverters 306b and 308b, logic AND gates 310b and 312b, and feedback cross-coupled logic NOR gates 314b and 316b. Such comparators 302b and 304b may be configured such that comparator 302b receives output voltage $v_{OUT}$ at its negative input terminal and a predetermined reference voltage $v_{REFP}$ at its positive input terminal and comparator 304b receives a predetermined threshold voltage $v_{THP}$ at its negative input terminal and the pull-up driver device driving signal voltage $v_P$ at its positive input terminal. In operation, as output voltage $v_{OUT}$ decreases, the output of comparator 302b may toggle from a logic 0 to a logic 1 when $v_{OUT}$ decreases below the predetermined reference voltage $v_{REFP}$. Similarly, as the pull-up driver device driving signal voltage $v_P$ decreases, the output of comparator 304b may toggle from a logic 0 to a logic 1 when $v_P$ increases above the predetermined threshold voltage $v_{THP}$.

Inverters 306b and 308b may be configured such that inverter 306b receives the output of comparator 302b at its input and inverter 308b receives the output of comparator 304b at its input. Logic AND gate 310b may be configured such that it receives the output of inverter 306b at one of its input terminals and the output of comparator 304b at its other input terminal Logic AND gate 312b may be configured such that it receives the output of inverter 308b at one of its input terminals and the output of comparator 302b at its other input terminal. Logic NOR gate 314b may be configured such that it receives the output of AND gate 310b at one of its input terminals, the output of logic NOR gate 316b at its other input terminal, and generates an output signal CURRENT_OUT_FALL 320d which is asserted if $v_{OUT}$ decreases below the predetermined reference voltage $v_{REFP}$ before $v_P$ increases above the predetermined threshold voltage $v_{THP}$, thus indicating that output current $i_{OUT}$ is flowing "out" from load 220 to switched output stage 201. Similarly, logic NOR gate 316b may be configured such that it receives the output of AND gate 312b at one of its input terminals, the output of logic NOR gate 314b at its other input terminal, and generates an output signal CURRENT_IN_FALL 320c which is asserted if $v_P$ increases above the predetermined threshold voltage $v_{THP}$ before $v_{OUT}$ decreases below the predetermined reference voltage $v_{REFP}$, thus indicating that output current $i_{OUT}$ is flowing "in" from switched output stage 201 to load 220.

Signal selector 322 may, based on whether $v_{OUT}$ is rising or falling, select one of CURRENT_IN_RISE signal 320a and CURRENT_IN_FALL signal 320c, and output current direction signal CURRENT_IN 214. In the embodiments represented by FIG. 3, signal selector 322 may comprise an edge detection circuit 324 to determine whether $v_{OUT}$ is rising or falling, such that the output of such edge detection circuit 324 is used as a select signal for multiplexer 326 to select between CURRENT_IN_RISE signal 320a and CURRENT_IN_FALL signal 320c to be current direction signal CURRENT_IN 214. In other embodiments, signal selector 322 may be configured to determine which of CURRENT_IN_RISE signal 320a and CURRENT_IN_FALL signal 320c was the most recent signal of the two to transition, and select as current direction signal CURRENT_IN 214 the signal that most recently transitioned.

Figure 4A:
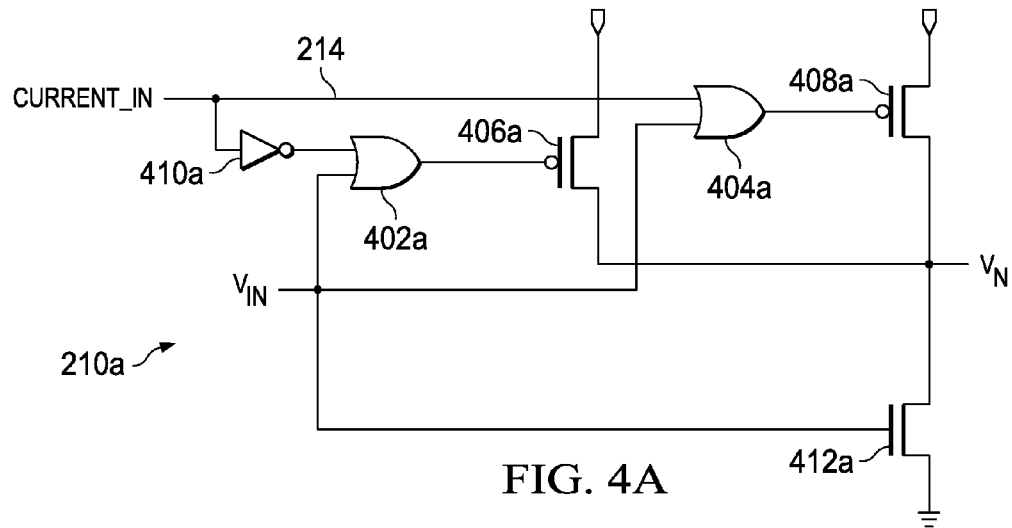
FIG. 4A illustrates an example pull-down driver device predriver circuit, in accordance with embodiments of the present disclosure.

FIG. 4A illustrates an example pull-down driver device predriver circuit 210a, in accordance with embodiments of the present disclosure. As shown in FIG. 4A, pull-down driver device predriver circuit 210a may include logic OR gates 402a and 404a, pull-up devices 406a and 408a (e.g., p-type metal-oxide-semiconductor field effect transistors) each coupled at its non-gate terminals between a supply voltage and the gate terminal of pull-down driver device 204, a pull-down device 412a (e.g., an n-type metal-oxide-semiconductor field effect transistor) coupled at its non-gate terminals between a ground voltage and the gate terminal of pull-down driver device 204, and a logic inverter 410a. In some embodiments, pull-up device 408a may have a greater drive strength (e.g., greater size) than pull-up device 406a.

Logic OR gate 402a may be configured such that it receives the complement of CURRENT_IN signal 214 (e.g., as logically inverted by logic inverter 410a) at one of its input terminals and input voltage $v_{IN}$ at its other terminal and drives the gate terminal of pull-up device 406a. Similarly, logic OR gate 404a may be configured such that it receives CURRENT_IN signal 214 (e.g., from output current direction detection circuit 208 depicted in FIG. 3) at one of its input terminals and input voltage $v_{IN}$ at its other terminal and drives the gate terminal of pull-up device 408a. Thus, during a falling edge of output voltage signal $v_{OUT}$, if the output current $i_{OUT}$ is determined to be flowing "in" from load 220 to switched output stage 201, pull-down driver device predriver circuit 210a may drive pull-down driver device driving signal voltage $v_N$ to the gate terminal of pull-down driver device 204 with a smaller drive strength than if the output current $i_{OUT}$ is determined to be flowing "out" to load 220 from switched output stage 201.

Figure 4B:
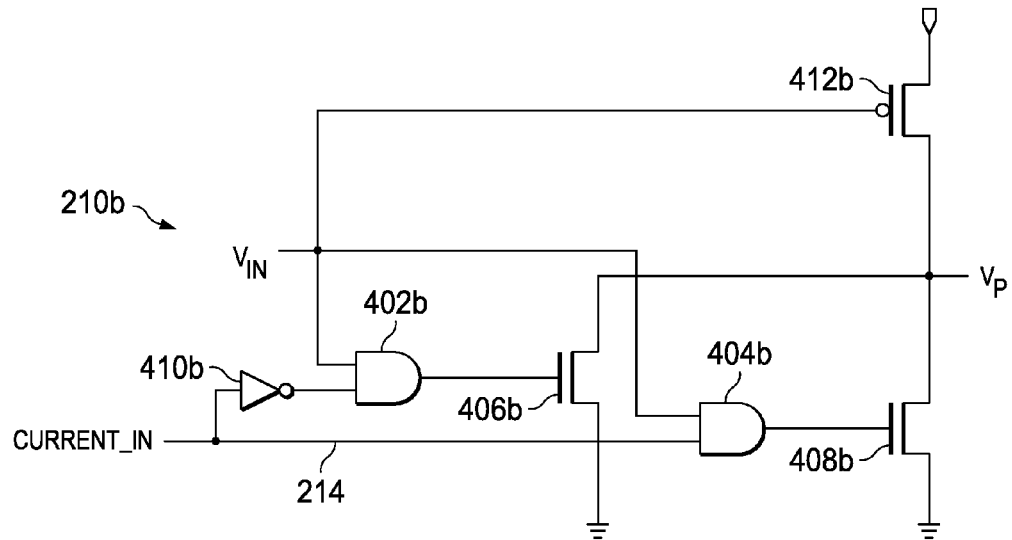
FIG. 4B illustrates an example pull-up driver device predriver circuit, in accordance with embodiments of the present disclosure.

FIG. 4B illustrates an example pull-up driver device predriver circuit 210b, in accordance with embodiments of the present disclosure. As shown in FIG. 4B, pull-up driver device predriver circuit 210b may include logic AND gates 402b and 404b, pull-down devices 406b and 408b (e.g., n-type metal-oxide-semiconductor field effect transistors) each coupled at its non-gate terminals between a ground voltage and the gate terminal of pull-up driver device 202, a pull-up device 412b (e.g., an n-type metal-oxide-semiconductor field effect transistor) coupled at its non-gate terminals between a ground voltage and the gate terminal of pull-up driver device 202, and a logic inverter 410b. In some embodiments, pull-up device 408b may have a greater drive strength (e.g., greater size) than pull-up device 406b.

Logic AND gate 402b may be configured such that it receives the complement of CURRENT_IN signal 214 (e.g., as logically inverted by logic inverter 410b) at one of its input terminals and input voltage $v_{IN}$ at its other terminal and drives the gate terminal of pull-down device 406b. Similarly, logic AND gate 404b may be configured such that it receives CURRENT_IN signal 214) (e.g., from output current direction detection circuit 208 depicted in FIG. 3) at one of its input terminals and input voltage $v_{IN}$ at its other terminal and drives the gate terminal of pull-down device 408b. Thus, during a rising edge of output voltage signal $v_{OUT}$, if the output current $i_{OUT}$ is determined to be flowing "in" from load 220 to switched output stage 201, pull-up driver device predriver circuit 210b may drive pull-up driver device driving signal voltage $v_P$ to the gate terminal of pull-up driver device 202 with a smaller drive strength than if the output current $i_{OUT}$ is determined to be flowing "out" to load 220 from switched output stage 201.

FIG. 5A illustrates another example pull-down driver device predriver circuit 210a coupled to another example output current direction detection circuit 208, in accordance with embodiments of the present disclosure. As shown in FIG. 5A, pull-down driver device predriver circuit 210a may include logic OR gates 502a and 504a, pull-up devices 506a and 508a (e.g., p-type metal-oxide-semiconductor field effect transistors) each coupled at its non-gate terminals between a supply voltage and the gate terminal of pull-down driver device 204, and a pull-up device 512a (e.g., an n-type metal-oxide-semiconductor field effect transistor) coupled at its non-gate terminals between a ground voltage and the gate terminal of pull-down driver device 204. In some embodiments, pull-up device 506a may have a greater drive strength (e.g., greater size) than pull-up device 508a.

In addition, as shown in FIG. 5A, output current direction detection circuit 208 may include comparators 513a and 514a. Comparators 513a and 514a may be configured such that comparator 513a receives output voltage $v_{OUT}$ at its positive input terminal and a predetermined reference voltage $v_{REFP}$ at its negative input terminal and comparator 514a receives a predetermined threshold voltage $v_{THP}$ at its positive input terminal and the pull-up driver device driving signal voltage $v_P$ at its negative input terminal. In operation, as output voltage $v_{OUT}$ decreases, the output of comparator 513a may toggle from a logic 1 to a logic 0 when $v_{OUT}$ decreases below the predetermined reference voltage $v_{REFP}$. Similarly, as the pull-down driver device driving signal voltage $v_P$ increases, the output of comparator 514a may toggle from a logic 1 to a logic 0 when $v_P$ increases above the predetermined threshold voltage $v_{THP}$.

Logic OR gate 502a may be configured such that it receives the output of comparator 513a at one of its input terminals and input voltage $v_{IN}$ at its other terminal and drives the gate terminal of pull-up device 506a. Similarly, logic OR gate 504a may be configured such that it receives the output of comparator 514a at one of its input terminals and input voltage $v_{IN}$ at its other terminal and drives the gate terminal of pull-up device 508a. Thus, during a falling edge of output voltage signal $v_{OUT}$, if the output current $i_{OUT}$ is determined to be flowing "in" from load 220 to switched output stage 201 (e.g., as indicated by $v_{OUT}$ decreasing below the predetermined reference voltage $v_{REFP}$ after $v_P$ increases above the predetermined threshold voltage $v_{THP}$), pull-down driver device predriver circuit 210a may first enable smaller pull-up device 508a and then enable larger pull-up device 506a as a secondary pull-down device. Alternatively, during a falling edge of output voltage signal $v_{OUT}$, if the output current $i_{OUT}$ is determined to be flowing "out" to load 220 from switched output stage 201 (e.g., as indicated by $v_{OUT}$ decreasing below the predetermined reference voltage $v_{REFP}$ before $v_P$ increases above the predetermined threshold voltage $v_{THP}$), pull-down driver device predriver circuit 210a may first enable larger pull-up device 506a and then enable smaller pull-down device 508a as a secondary pull-up device.

FIG. 5B illustrates another example pull-up driver device predriver circuit 210b coupled to another example output current direction detection circuit 208, in accordance with embodiments of the present disclosure. As shown in FIG. 5B, pull-up driver device predriver circuit 210b may include logic AND gates 502b and 504b, pull-down devices 506b and 508b (e.g., n-type metal-oxide-semiconductor field effect transistors) each coupled at its non-gate terminals between a ground voltage and the gate terminal of pull-down driver device 204, and a pull-up device 512b (e.g., a p-type metal-oxide-semiconductor field effect transistor) coupled at its non-gate terminals between a supply voltage and the gate terminal of pull-up driver device 204. In some embodiments, pull-down device 508b may have a greater drive strength (e.g., greater size) than pull-down device 506b.

In addition, as shown in FIG. 5B, output current direction detection circuit 208 may include comparators 513b and 514b. Comparators 513b and 514b may be configured such that comparator 514b receives output voltage $v_{OUT}$ at its positive input terminal and a predetermined reference voltage $v_{REFN}$ at its negative input terminal and comparator 513b receives a predetermined threshold voltage $v_{THN}$ at its positive input terminal and the pull-down driver device driving signal voltage $v_N$ at its negative input terminal. In operation, as output voltage $v_{OUT}$ increases, the output of comparator 514b may toggle from a logic 0 to a logic 1 when $v_{OUT}$ increases above the predetermined reference voltage $v_{REFN}$. Similarly, as the pull-down driver device driving signal voltage $v_N$ decreases, the output of comparator 513b may toggle from a logic 0 to a logic 1 when $v_N$ decreases below the predetermined threshold voltage $v_{THN}$.

Logic AND gate 502b may be configured such that it receives the output of comparator 513b at one of its input terminals and input voltage $v_{IN}$ at its other terminal and drives the gate terminal of pull-down device 506b. Similarly, logic AND gate 504b may be configured such that it receives the output of comparator 514b at one of its input terminals and input voltage $v_{IN}$ at its other terminal and drives the gate terminal of pull-down device 508b. Thus, during a rising edge of output voltage signal $v_{OUT}$, if the output current $i_{OUT}$ is determined to be flowing "in" from load 220 to switched output stage 201 (e.g., as indicated by $v_{OUT}$ increasing above the predetermined reference voltage $v_{REFN}$ before $v_N$ decreases below the predetermined threshold voltage $v_{THN}$), pull-up driver device predriver circuit 210b may first enable larger pull-down device 508b and then enable smaller pull-up device 506b as a secondary pull-down device. Alternatively, during a rising edge of output voltage signal $v_{OUT}$ if the output current $i_{OUT}$ is determined to be flowing "out" to load 220 from switched output stage 201 (e.g., as indicated by $v_{OUT}$ increasing above the predetermined reference voltage $v_{REFN}$ after $v_N$ decreases below the predetermined threshold voltage $v_{THN}$), pull-up driver device predriver circuit 210b may first enable smaller pull-up device 506b and then enable larger pull-down device 508b as a secondary pull-up device.

Although various pull-up devices are depicted in the foregoing figures as p-type metal-on-semiconductor field-effect transistors, one or more of such pull-up devices may be implemented using any system, device, or apparatus capable of acting as a switch between its non-gate terminals based on an input received at its gate terminal. For example, in some embodiments, one or more of the pull-up devices described herein may be implemented as an n-type metal-on-semiconductor field-effect transistor. Similarly, although various pull-down devices are depicted in the foregoing figures as n-type metal-on-semiconductor field-effect transistors, one or more of such pull-down devices may be implemented using any system, device, or apparatus capable of acting as a switch between its non-gate terminals based on an input received at its gate terminal. For example, in some embodiments, one or more of the pull-down devices described herein may be implemented as a p-type metal-on-semiconductor field-effect transistor.

Figure 6:
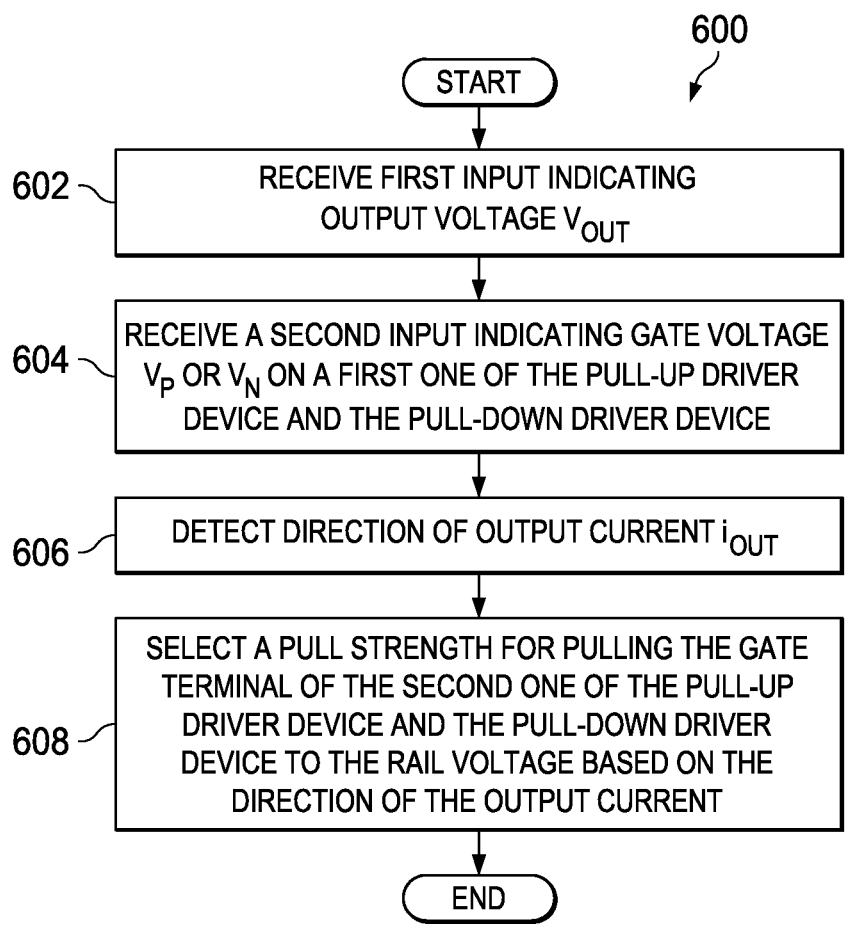
FIG. 6 illustrates a flow chart of an example method for controlling a signal edge based on a detected output current direction in a switched output stage of a power converter, in accordance with embodiments of the present disclosure.

FIG. 6 illustrates a flow chart of an example method 600 for controlling a signal edge based on a detected output current direction in a switched output stage of a power converter, in accordance with embodiments of the present disclosure. According to certain embodiments, method 600 may begin at step 602. As noted above, teachings of the present disclosure may be implemented in a variety of configurations of circuit 300. As such, the preferred initialization point for method 600 and the order of the steps 602-608 comprising method 600 may depend on the implementation chosen.

At step 602, an output current direction detection circuit (e.g., output current direction detection circuit 208) may receive a first input indicating an output voltage (e.g., $v_{OUT}$) of a switched output stage (e.g., switched output stage 201) comprising a pull-down driver device (e.g., pull-down driver device 204) coupled at its non-gate terminals between a ground voltage and the output node and a pull-up driver device (e.g., pull-down driver device 202) coupled at its non-gate terminals between a supply voltage and the output node.

At step 604, the output current direction detection circuit may receive a second input indicating an output voltage of a gate terminal of a first one of the pull-up driver device and the pull-down driver device (e.g., either of pull-up driver device driving signal voltage $v_P$ or pull-down driver device driving signal voltage $v_N$).

At step 606, the output current direction detection circuit may detect direction of an output current flowing into or out of the output node based on the first input and the second input. In some embodiments, the output current direction detection circuit may detect direction of the output current for a rising edge of an output voltage (e.g., $v_{OUT}$) by determining whether the gate voltage (e.g., $v_N$) crosses a first threshold voltage level (e.g., $v_{THN}$) before the output voltage (e.g., $v_{OUT}$) crosses a second threshold voltage level (e.g., $v_{REFN}$). For example, the output current direction detection circuit may determine that output current is flowing into the output node from a load coupled thereto if the output voltage crosses the second threshold voltage level before the gate voltage crosses the first threshold voltage level. As another example, the output current direction detection circuit may determine that the output current is flowing away from the output node to a load coupled thereto if the gate voltage crosses the first threshold voltage level before the output voltage crosses the second threshold voltage level.

Similarly, in the case of a falling edge of an output voltage (e.g., $v_{OUT}$), the output current direction detection circuit may detect direction of the output current for a falling edge of an output voltage (e.g., $v_{OUT}$) by determining whether the gate voltage (e.g., $v_P$) crosses a first threshold voltage level (e.g., $v_{THP}$) after the output voltage (e.g., $v_{OUT}$) crosses a second threshold voltage level (e.g., $v_{REFP}$). For example, the output current direction detection circuit may determine that output current is flowing into the output node from a load coupled thereto if the output voltage crosses the second threshold voltage level after the gate voltage crosses the first threshold voltage level. As another example, the output current direction detection circuit may determine that the output current is flowing away from the output node to a load coupled thereto if the gate voltage crosses the first threshold voltage level after the output voltage crosses the second threshold voltage level.

At step 608, a pull circuit (e.g., a driver device predriver circuit 210) may select a drive strength for driving the gate terminal of the second one of the pull-up driver device and the pull-down driver device to a rail voltage (e.g., a supply voltage or a ground voltage) based on the direction of the output current. For example, if determining current direction during a falling edge of an output voltage (e.g., $v_{OUT}$) based on the output voltage (e.g., $v_{OUT}$) and a pull-up driver device driving signal voltage (e.g., $v_P$) driving the gate terminal of the pull-up device of the switched output stage (e.g., pull-up device 102), a pull-down circuit (e.g., pull-down driver device predriver circuit 210a) may select a drive strength for driving the gate terminal of a pull-down device (e.g., pull-down device 104) to a ground voltage based on the direction of the output current (e.g., selecting a larger drive strength if output current is flowing "in" from the load to the switched output stage than if output current is flowing "out" to the load from the switched output stage). As another example, if determining current direction during a rising edge of an output voltage (e.g., $v_{OUT}$) based on the output voltage (e.g., $v_{OUT}$) and a pull-down driver device driving signal voltage (e.g., $v_N$) driving the gate terminal of the pull-down device of the switched output stage (e.g., pull-down device 104), a pull-up circuit (e.g., pull-up driver device predriver circuit 210b) may select a drive strength for driving the gate terminal of a pull-down device (e.g., pull-down device 104) to a supply voltage based on the direction of the output current (e.g., selecting a larger drive strength if output current is flowing "out" to the load from the switched output stage than if output current is flowing "in" from the load to the switched output stage). In the illustrated embodiment, after completion of step 608, method 600 may end.

Although FIG. 6 discloses a particular number of steps to be taken with respect to method 600, method 600 may be executed with greater or fewer steps than those depicted in FIG. 6. In addition, although FIG. 6 discloses a certain order of steps to be taken with respect to method 600, the steps comprising method 600 may be completed in any suitable order.

Method 600 may be implemented using circuit 300 and/or any other system operable to implement method 600. In certain embodiments, method 600 may be implemented partially or fully in software and/or firmware embodied in computer-readable media comprising machine-readable instructions for implementing method 600.

As used herein, when two or more elements are referred to as "coupled" to one another, such term indicates that such two or more elements are in electronic communication whether connected indirectly or directly, without or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An apparatus comprising:
 a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node;
 a second input configured to indicate a gate voltage of a gate terminal of a first one of the pull-up driver device and the pull-down driver device; and
 an output current direction detection circuit configured to detect direction of an output current flowing into or out of the output node based on the first input and the second input by determining whether the gate voltage crosses a first threshold voltage level before the output voltage crosses a second threshold voltage level.

2. The apparatus of claim 1, the output current direction detection circuit configured to, during a rising edge of the output voltage, determine that output current is flowing into the output node from a load coupled thereto if the output voltage crosses the second threshold voltage level before the gate voltage crosses the first threshold voltage level.

3. The apparatus of claim 1, the output current direction detection circuit configured to, during a rising edge of the output voltage, determine that the output current is flowing from the output node to a load coupled thereto if the gate voltage crosses the first threshold voltage level before the output voltage crosses the second threshold voltage level.

4. The apparatus of claim 1, the output current direction detection circuit configured to, during a falling edge of the output voltage, determine that the output current is flowing from the output node to a load coupled thereto if the output voltage crosses the second threshold voltage level before the gate voltage crosses the first threshold voltage level.

5. The apparatus of claim 1, the output current direction detection circuit configured to, during a falling edge of the output voltage, determine that the output current is flowing into the output node from a load coupled thereto if the gate voltage crosses the first threshold voltage level before the output voltage crosses the second threshold voltage level.

6. The apparatus of claim 1, wherein:
 the second input is configured to indicate the gate voltage of the gate terminal of the pull-up driver device during a rising edge of the output voltage;
 the apparatus comprises a pull-up circuit configured to drive the gate terminal of the pull-down driver device to a supply voltage; and
 the pull-up circuit is configured to select a drive strength for driving the gate terminal of the pull-down driver device to the supply voltage based on the direction of the output current.

7. The apparatus of claim 6, wherein the pull-up circuit comprises:
 a first pull-up device configured to be selectively enabled based on the first input; and
 a second pull-up device configured to be selectively enabled based on the second input.

8. The apparatus of claim 1, wherein:
 the second input is configured to indicate the gate voltage of the gate terminal of the pull-down driver device during a falling edge of the output voltage;
 the apparatus comprises a pull-down circuit configured to drive the gate terminal of the pull-up driver device to a ground voltage; and
 the pull-down circuit is configured to select a drive strength for driving the gate terminal of the pull-up driver device to the ground voltage based on the direction of the output current.

9. The apparatus of claim 8, wherein the pull-down circuit comprises:
 a first pull-down device configured to be selectively enabled based on the first input; and
 a second pull-down device configured to be selectively enabled based on the second input.

10. The apparatus of claim 1, wherein at least one of the pull-up driver device and the pull-down driver device comprises at least a portion of an output stage of a power converter.

11. The apparatus of claim 1, wherein at least one of the pull-up driver device and the pull-down driver device comprises at least a portion of an output stage of a Class-D amplifier.

12. A method comprising:
 receiving a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node;
 receiving a second input configured to indicate a gate voltage of a gate terminal of a first one of the pull-up driver device and the pull-down driver device; and
 detecting direction of an output current flowing into or out of the output node based on the first input and the second input; wherein detecting direction of the output current comprises determining whether the gate voltage crosses a first threshold voltage level before the output voltage crosses a second threshold voltage level.

13. The method of claim 12, further comprising determining, during a rising edge of the output voltage, that output current is flowing into the output node from a load coupled thereto if the output voltage crosses the second threshold voltage level before the gate voltage crosses the first threshold voltage level.

14. The method of claim 12, further comprising determining, during a rising edge of the output voltage, that the output current is flowing from the output node to a load coupled thereto if the gate voltage crosses the first threshold voltage level before the output voltage crosses the second threshold voltage level.

15. The method of claim 12, further comprising determining, during a falling edge of the output voltage, that the output current is flowing from the output node to a load coupled thereto if the output voltage crosses the second threshold voltage level before the gate voltage crosses the first threshold voltage level.

16. The method of claim 12, further comprising determining, during a falling edge of the output voltage, that the output current is flowing into the output node from a load coupled thereto if the gate voltage crosses the first threshold voltage level before the output voltage crosses the second threshold voltage level.

17. The method of claim 12, wherein the second input is configured to indicate the gate voltage of the gate terminal of the pull-up driver device during a rising edge of the output voltage, and wherein the method further comprises:
 selecting drive strength for driving the gate terminal of the pull-down driver device to the supply voltage based on the direction of the output current; and
 driving the gate terminal of the pull-down driver device in accordance with the selected drive strength.

18. The method of claim 17, wherein selecting the drive strength comprises:
 selectively enabling a first pull-up device for driving the gate terminal of the pull-down driver device to the supply voltage based on the first input; and
 selectively enabling a second pull-up device for driving the gate terminal of the pull-down driver device to the supply voltage based on the second input.

19. The method of claim 12, wherein the second input is configured to indicate the gate voltage of the gate terminal of the pull-down driver device during a falling edge of the output voltage, and wherein the method further comprises:
 selecting drive strength for driving the gate terminal of the pull-up driver device to the ground voltage based on the direction of the output current; and
 driving the gate terminal of the pull-up driver device in accordance with the selected drive strength.

20. The method of claim 19, wherein selecting the drive strength comprises:
 selectively enabling a first pull-down device for driving the gate terminal of the pull-up driver device to the ground voltage based on the first input; and
 selectively enabling a second pull-down device for driving the gate terminal of the pull-up driver device to the ground voltage based on the second input.

21. The method of claim 12, wherein at least one of the pull-up driver device and the pull-down driver device comprises at least a portion of an output stage of a power converter.

22. The method of claim 12, wherein at least one of the pull-up driver device and the pull-down driver device comprises at least a portion of an output stage of a power converter.

23. An apparatus comprising:
 a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node;
 a second input configured to indicate a gate voltage of a gate terminal of a first one of the pull-up driver device and the pull-down driver device; and
 a predriver circuit configured to select a drive strength for driving the gate terminal of a second one of the pull-up driver device and the pull-down driver device to a rail voltage based on the first input and the second input.

24. The apparatus of claim 23, wherein:
 the second input is configured to indicate the gate voltage of the gate terminal of the pull-up driver device during a rising edge of the output voltage; and
 the predriver circuit comprises a pull-up circuit configured to:
  drive the gate terminal of the pull-down driver device to a supply voltage; and
  select a drive strength for driving the gate terminal of the pull-down driver device to the supply voltage based on the first input and the second input.

25. The apparatus of claim 24, wherein the pull-up circuit comprises:
 a first pull-up device configured to drive the gate terminal of the pull-down driver device to the supply voltage only when the output voltage is below a first threshold level; and
 a second pull-up device configured to drive the gate terminal of the pull-down driver device to the supply voltage only when the gate voltage of the gate terminal of the pull-up driver device is above a second threshold level.

26. The apparatus of claim 23, wherein:
 the second input is configured to indicate the gate voltage of the gate terminal of the pull-down driver device during a falling edge of the output voltage; and
 the predriver circuit comprises a pull-down circuit configured to:
  drive the gate terminal of the pull-up driver device to a supply voltage; and
  select a drive strength for driving the gate terminal of the pull-up driver device to the ground voltage based on the first input and the second input.

27. The apparatus of claim 26, wherein the pull-down circuit comprises:
 a first pull-down device configured to drive the gate terminal of the pull-up driver device to the ground voltage only when the output voltage is above a first threshold level; and
 a second pull-down device configured to drive the gate terminal of the pull-up driver device to the ground voltage only when the gate voltage of the gate terminal of the pull-down driver device is below a second threshold level.

28. A method comprising:
 receiving a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node;
 receiving a second input for configured to indicate a gate voltage of a gate terminal of a first one of the pull-up driver device and the pull-down driver device; and selecting a drive strength for driving the gate terminal of a second one of the pull-up driver device and the pull-down driver device to a rail voltage based on the first input and the second input.

29. The method of claim 28, wherein:
the second input is configured to indicate the gate voltage of the gate terminal of the pull-up driver device during a rising edge of the output voltage; and
the method further comprises driving the gate terminal of the pull-down driver device to a supply voltage based on the first input and the second input.

30. The method of claim 29, wherein driving the gate terminal of the pull-down driver device to the supply voltage based on the first input and the second input comprises:
driving the gate terminal of the pull-down driver device to the supply voltage by a first pull-up device only when the output voltage is below a first threshold level; and
driving the gate terminal of the pull-down driver device to the supply voltage by a second pull-up device only when the gate voltage of the gate terminal of the pull-up driver device is above a second threshold level.

31. The method of claim 28, wherein:
the second input is configured to indicate the gate voltage of the gate terminal of the pull-down driver device during a falling edge of the output voltage; and
the method further comprises driving the gate terminal of the pull-up driver device to a ground voltage based on the first input and the second input.

32. The method of claim 31, wherein driving the gate terminal of the pull-up driver device to the ground voltage based on the first input and the second input comprises:
driving the gate terminal of the pull-up driver device to the ground voltage by a first pull-down device only when the output voltage is above a first threshold level; and
driving the gate terminal of the pull-up driver device to the ground voltage by a second pull-down device only when the gate voltage of the gate terminal of the pull-down driver device is below a second threshold level.

* * * * *

UNITED STATES PATENT AND TRADEMARK OFFICE
CERTIFICATE OF CORRECTION

PATENT NO. : 8,872,561 B2
APPLICATION NO. : 13/829831
DATED : October 28, 2014
INVENTOR(S) : Dan Shen et al.

Page 1 of 1

It is certified that error appears in the above-identified patent and that said Letters Patent is hereby corrected as shown below:

In the Claims

Claim 28, should read

28. A method comprising;

receiving a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node;

receiving a second input configured to indicate a gate voltage of a gate terminal of a first one of the pull-up driver device and the pull-down driver device; and selecting a drive strength for driving the gate terminal of a second one of the pull-up driver device and the pull-down driver device to a rail voltage based on the first input and the second input.

Signed and Sealed this
Seventeenth Day of February, 2015

Michelle K. Lee
*Deputy Director of the United States Patent and Trademark Office*

UNITED STATES PATENT AND TRADEMARK OFFICE
CERTIFICATE OF CORRECTION

PATENT NO. : 8,872,561 B2
APPLICATION NO. : 13/829831
DATED : October 28, 2014
INVENTOR(S) : Dan Shen et al.

It is certified that error appears in the above-identified patent and that said Letters Patent is hereby corrected as shown below:

In the Claims

Col. 14, line 58 - Col. 15, line 4, Claim 28, should read

28. A method comprising;

receiving a first input configured to indicate an output voltage of an output node of a switched output stage comprising a pull-down driver device coupled at its non-gate terminals between a ground voltage and the output node and a pull-up driver device coupled at its non-gate terminals between a supply voltage and the output node;

receiving a second input configured to indicate a gate voltage of a gate terminal of a first one of the pull-up driver device and the pull-down driver device; and selecting a drive strength for driving the gate terminal of a second one of the pull-up driver device and the pull-down driver device to a rail voltage based on the first input and the second input.

This certificate supersedes the Certificate of Correction issued February 17, 2015.

Signed and Sealed this
Tenth Day of March, 2015

Michelle K. Lee
*Deputy Director of the United States Patent and Trademark Office*